(12) United States Patent
Borthakur et al.

(10) Patent No.: US 10,366,961 B1
(45) Date of Patent: Jul. 30, 2019

(54) IMAGE SENSORS WITH DEEP SILICON ETCH AND RELATED METHODS

(71) Applicant: SEMICONDUCTOR COMPONENTS INDUSTRIES, LLC, Phoenix, AZ (US)

(72) Inventors: Swarnal Borthakur, Boise, ID (US); Marc Allen Sulfridge, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/895,668

(22) Filed: Feb. 13, 2018

(51) Int. Cl.
| | |
|---|---|
| *H01L 23/00* | (2006.01) |
| *H01L 27/146* | (2006.01) |
| *H01L 23/48* | (2006.01) |
| *H01L 21/768* | (2006.01) |

(52) U.S. Cl.
CPC ........ *H01L 24/05* (2013.01); *H01L 21/76898* (2013.01); *H01L 23/481* (2013.01); *H01L 27/1464* (2013.01); *H01L 27/14636* (2013.01); *H01L 2224/0557* (2013.01); *H01L 2224/05557* (2013.01); *H01L 2224/05562* (2013.01); *H01L 2224/05567* (2013.01); *H01L 2224/05571* (2013.01)

(58) Field of Classification Search
CPC . H01L 21/76898; H01L 23/481; H01L 24/05; H01L 27/14636; H01L 27/1464
See application file for complete search history.

(56) References Cited

U.S. PATENT DOCUMENTS

| | | | |
|---|---|---|---|
| 7,544,592 B2 | 6/2009 | Kirby | |
| 8,110,488 B2 | 2/2012 | Kirby | |
| 9,691,811 B1 | 6/2017 | Borthakur | |
| 9,911,780 B1* | 3/2018 | Wang | ................. H01L 31/18 |
| 2010/0276787 A1 | 11/2010 | Yu | |
| 2010/0279483 A1 | 11/2010 | Collins | |
| 2012/0001286 A1* | 1/2012 | Yoon | ................. H01L 27/14618 257/432 |
| 2013/0323875 A1 | 12/2013 | Park | |
| 2017/0104019 A1* | 4/2017 | Jung | ................. H01L 23/373 |

\* cited by examiner

*Primary Examiner* — Andrew Q Tran
(74) *Attorney, Agent, or Firm* — IPTechLaw (57) ABSTRACT

Implementations of image sensors may include a silicon layer having a first side and a second side opposite the first side, an opening extending into the silicon layer from the first side of the silicon layer toward the second side, a via extending into the silicon layer from the second side of the silicon layer, and a conductive pad within the opening. The conductive pad may be coupled to the via. The opening may include a fill material. At least a portion of the fill material may form a plane that is substantially parallel with the first side of the silicon layer. The conductive pad may be exposed through an opening in the fill material.

16 Claims, 10 Drawing Sheets

IMAGE SENSORS WITH DEEP SILICON ETCH AND RELATED METHODS

BACKGROUND

1. Technical Field

Aspects of this document relate generally image sensor semiconductor packages (referred to herein as "image sensors"). More specific implementations involve the conductive pad region of backside illumination (BSI) image sensors.

2. Background

Image sensors convey information related to an image by communicating signals in response to incident electromagnetic radiation. Image sensors are used in a variety of devices including smart phones, digital cameras, night vision devices, medical imagers, and many others. BSI image sensors may be used to improve the light receiving efficiency of the image sensor, particularly for specific light wavelengths.

SUMMARY

Implementations of image sensors may include a silicon layer having a first side and a second side opposite the first side, an opening extending into the silicon layer from the first side of the silicon layer toward the second side, a via extending into the silicon layer from the second side of the silicon layer, and a conductive pad within the opening. The conductive pad may be coupled to the via. The opening may include a fill material. At least a portion of the fill material may form a plane that is substantially parallel with the first side of the silicon layer. The conductive pad may be exposed through an opening in the fill material.

Implementations of image sensors may include one, all, or any of the following:

A dielectric layer may be included between the silicon layer and the via.

A dielectric layer may be included between the fill material and the silicon layer.

A high dielectric constant dielectric layer may be included between the fill material and the silicon layer.

A second via may be included that extends into the silicon layer from the second side of the via, the second via electrically coupled to the conductive pad.

A perimeter etch may be included through the silicon layer.

The silicon layer may be substantially 6 micrometers thick and the opening may be substantially 2.5 micrometers deep.

The via may include copper.

Implementations of image sensors may include a silicon layer having a first side and a second side opposite the first side, a first opening extending through the silicon layer, a second opening extending into the silicon layer from the first side of the silicon layer, a via extending into the silicon layer from the second side of the silicon layer, and a conductive pad within the second opening. The conductive pad may be coupled to the via. The opening may include a fill material. At least a portion of the fill material may form a plane that is substantially parallel with the first side of the silicon layer. The conductive pad may be exposed through an opening in the fill material.

Implementations of image sensors may include one, all, or any of the following:

A dielectric layer may be included between the silicon layer and the via.

A dielectric layer may be included between the fill material and the silicon layer.

A high dielectric constant dielectric layer may be included between the fill material and the silicon layer.

The first opening may extend around a perimeter of the conductive pad.

The first opening may further include a first portion wider than a second portion.

The silicon layer may be substantially 6 micrometers thick and the opening may be substantially 2.5 micrometers deep.

Implementations of methods for forming conductive pad regions of image sensors may include etching an opening into a second side of a silicon layer, forming a via within the opening in the second side of the silicon layer, etching an opening into a first side of a silicon layer, forming a dielectric layer over the first side of the silicon layer, etching through the dielectric layer to expose the via, and forming a conductive pad within the opening in the first side of the silicon layer. The conductive pad may be coupled to the via. Implementations of methods for forming conductive pad regions of image sensors may also include filling the opening in the first side of the silicon layer with a fill material, planarizing the fill material to form a plane substantially parallel with the first side of the silicon layer, and etching an opening through the fill material to expose the conductive pad.

Implementations of methods for forming conductive pad regions of image sensors may include one, all, or any of the following:

The method may include forming a perimeter opening entirely through the silicon layer.

The method may include forming a dielectric layer between the via and the silicon layer.

The perimeter opening may be stepped.

The silicon layer may be substantially 6 micrometers thick and the opening may be substantially 2.5 micrometers deep.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended image sensors will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such image sensors, and implementing components and methods, consistent with the intended operation and methods.

Figure 1:
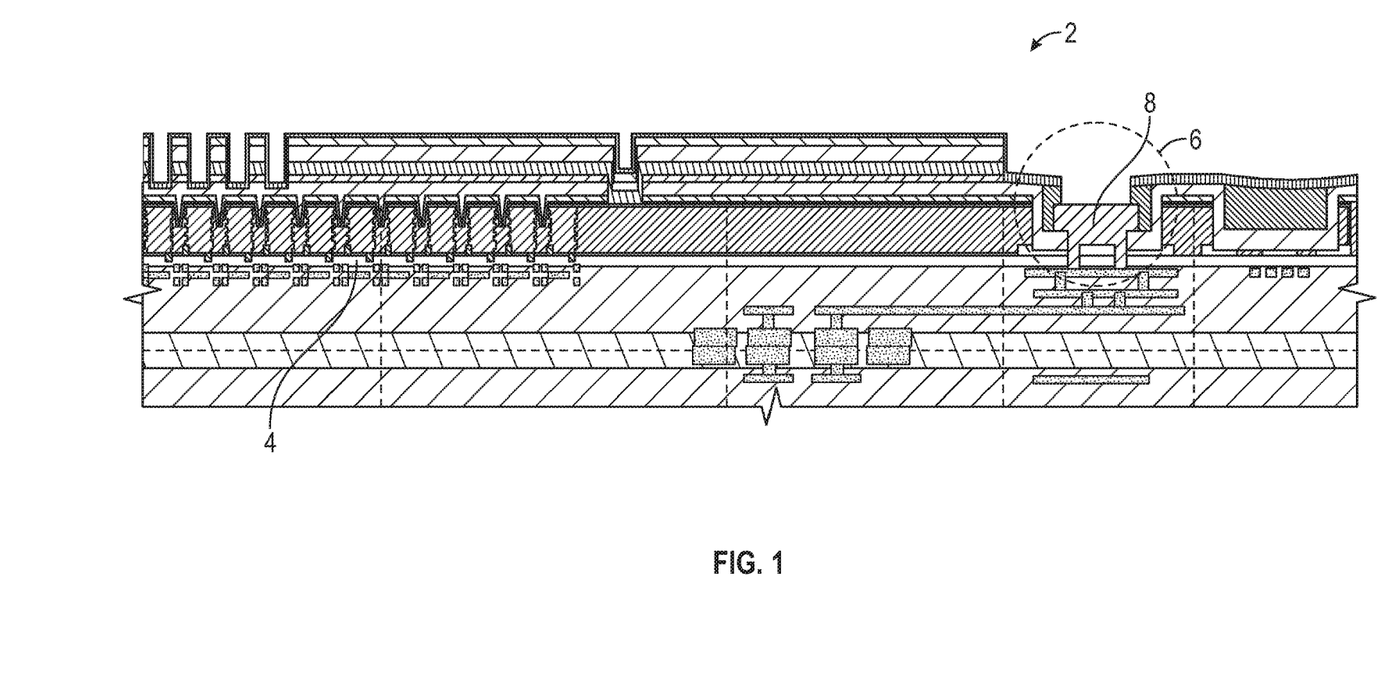
FIG. 1 is a cross-section side view of a portion of an image sensor.

Referring to FIG. 1, a cross-section side view of a portion of an image sensor is illustrated. While the FIG. 1 illustrates many components of an image sensor 2, such as a pixel array 4, this disclosure is primarily focused on region 6, referred to herein as the conductive pad region as it includes a conductive pad 8 that may be used to either test the image sensor or electrically couple the image sensor to external devices. This conductive pad is typically located on the edge or near the edge of the die or in the scribeline area of the die in various implementations, though in some implementations the conductive pad may be located in the interior of the die. While the components and methods of this document are primarily taught within the context of a BSI image sensor, it is understood that the devices and methods disclosed herein can be applied to image sensors that are not BSI image sensors, and even to semiconductor packages that are not image sensors.

Figure 2A:
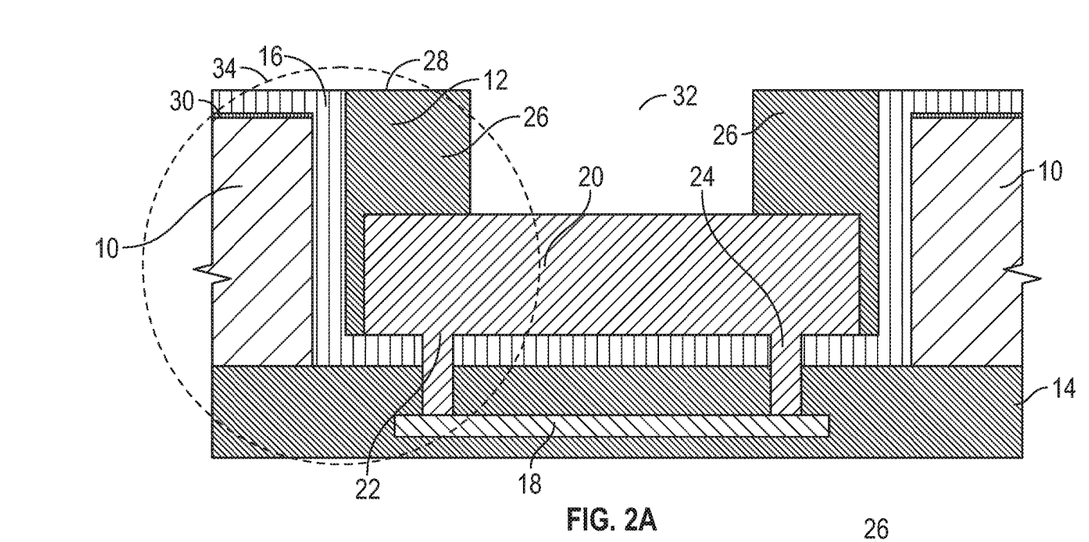
FIG. 2A is a magnified cross-section side view of the conductive pad region of an image sensor.
Figure 2B:
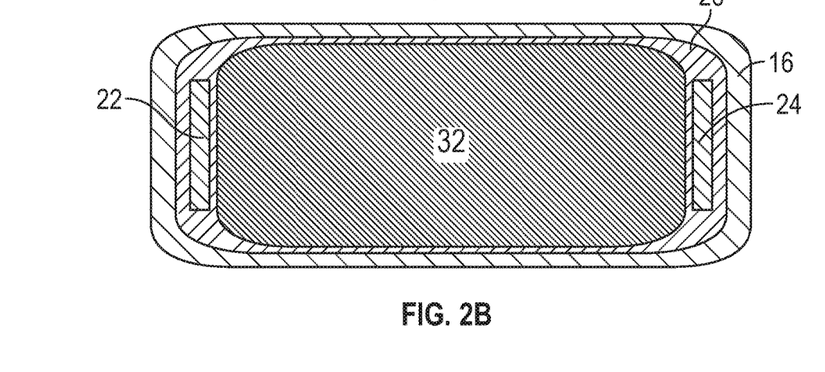
FIG. 2B is a top view of FIG. 2A.

Referring to FIGS. 2A-2B, magnified cross-section views of a conductive pad region, similar to region 6 of FIG. 1, are illustrated. Specifically, FIG. 2A illustrates a magnified cross-section side view of the conductive pad region of an image sensor. Referring to FIG. 2A, the image sensor may include a silicon layer 10. It is understood that where this disclosure refers to a silicon layer, the silicon layer could be any type of silicon layer including by non-limiting example, an epitaxial silicon layer, silicon on insulator, polysilicon, any combination thereof, or any other silicon-containing substrate material. Further, it is also understood that in various implementations a substrate other than a silicon-containing substrate may be used, such as, by non-limiting example, gallium arsenide, or a metal-containing substrate.

The image sensor includes an opening 12 within the silicon layer 10. In the implementation illustrated by FIG. 2A, the depth of the opening, as well as the thickness of the semiconductor layer 10, is shallow and may be about 2.5 micrometers (um). In various implementations, the length of the opening 12 may be about 100 um long and about 80 um wide. FIG. 2A is not drawn to scale for the purpose of clearly illustrating the different elements of FIG. 2A, however, region 34 is shown drawn to scale in FIG. 3.

In various implementations, the image sensor may include a first dielectric layer 14. The first dielectric layer may be an interlayer dielectric (ILD), and in particular implementations, may be $SiO_2$. In various implementations, the image sensor may also include a second dielectric layer 16 that may be formed over the silicon layer 10 and within the opening 12. The second dielectric layer may be $SiO_2$ and may act as a sidewall passivation layer as it covers the sidewalls of the opening 12. In various implementations, the second dielectric layer may be about 300 nanometers (nm) thick.

The image sensor includes a conductive layer 18 that may be within the first dielectric layer 14. In various implementations, the conductive layer 18 may be metallic. In such implementations, the conductive layer may be, by non-limiting example, copper, gold, silver, aluminum, any other metal or metallic alloy, and any combinations thereof. The conductive layer 18 may be coupled to a conductive pad 20. In various implementations, the conductive pad 20 is a bond pad which may be used to couple external devices to the image sensor. In other implementations, the conductive pad 20 may be a test pad used to electrically test the components of the image sensor. In such implementations, the test pad may not be used to couple the image sensor to external devices as would be done with a bond pad. In still other implementations, the conductive pad 20 may be used as both a test pad and a bond pad. In various implementations, and as illustrated by FIG. 2A, the conductive pad 20 may be directly coupled to the conductive layer 18. The conductive pad 20 illustrated in FIG. 2A includes a first portion 22 and a second portion 24 which extend through the first 14 and second 16 dielectric layers and couple to the conductive layer 18. In various implementations, the conductive pad may have only one or more than two portions that extend through the dielectric layers and couple to the conductive layer.

The opening 12 may include a fill material 26. The fill material may be the same material as or a different material from the dielectric materials disclosed herein but is generally selected of a material that is electrically insulative. As illustrated in FIG. 2A, the surface 28 of the fill material may form a plane substantially parallel with a plane formed by the surface 30 of the silicon layer 10. The fill material 26 may have an opening 32 therein and the conductive pad 20 may be exposed through the opening 32.

Referring to FIG. 2B, a top view of FIG. 2A is illustrated. Though FIG. 2A and FIG. 2B are not drawn to scale with respect to one another, FIG. 2B illustrates the perimeters of the elements of FIG. 2A, specifically the opening 32 in the fill material 26, the fill material 26, and the dielectric layer 16. Portions 22 and 24 of the conductive pad, though not technically exposed from a top view, are illustrated in FIG. 2B to show the relative position of such elements.

Figure 3:
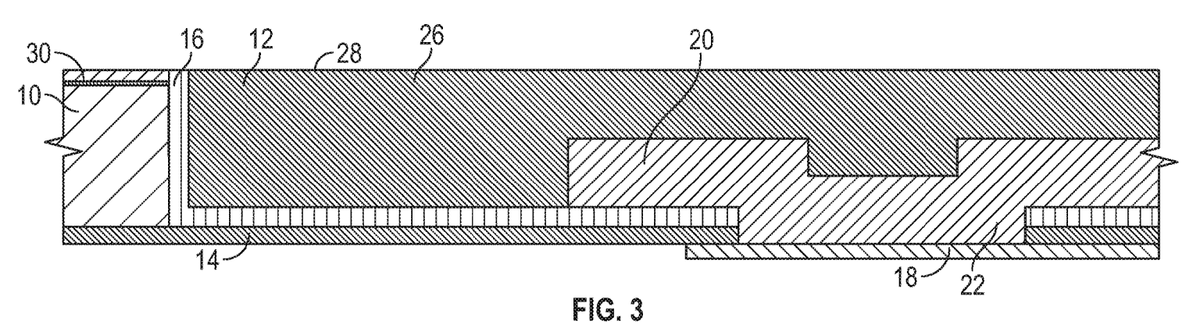
FIG. 3 is a cross-section side view of a portion of a conductive pad region of the image sensor of FIG. 2A.

Referring now to FIG. 3, a cross-section side view of a portion of the conductive pad region of the image sensor of FIG. 2A is illustrated. FIG. 3 illustrates a magnified view of the region 34 of FIG. 2A, however, this region is drawn to scale in FIG. 3. As illustrated by FIG. 3, the image sensor includes the silicon layer 10, the opening 12, the fill material 26, the conductive pad 20, the conductive layer 18, the first dielectric layer 14, and the second dielectric layers 16, all of which are cut off on the right side of FIG. 3 in order to show the conductive pad region to scale. This view of the conductive pad region is used through the remaining figures in order to show what the conductive pad region looks like as drawn to scale. It is understood that the conductive pad region also includes an opening, which is not shown in FIG. 3, such as opening 32 of FIG. 2A, through which the conductive pad is exposed. It is also understood that the conductive pad may include multiple portions of a conductive pad that are coupled to a conductive layer rather than the one portion 22 illustrated in FIG. 3. Further, it is understood that though the left side of the conductive pad region is shown in FIG. 3, the conductive pad region may also include a symmetrical right side of the conductive pad region, as illustrated in FIG. 2A. Lastly, only a portion of the first dielectric layer 14 is illustrated by FIG. 3, though it is understood that the first dielectric layer may extend beyond what is shown in FIG. 3 (for example, the first dielectric layer 14 may encapsulate the conductive layer 18).

As previously discussed, the silicon layer 10 of FIG. 3 is substantially 2.5 um thick in various implementations. The surface 28 of the fill material 26 is planarized so that it is coplanar with the top of the dielectric material 16, or so that it forms a plane substantially parallel with a plane formed by the surface 30 of the silicon layer. Because the silicon layer is only about 2.5 um thick, it is feasible to include the fill material 26 in the opening 12 and have it planarized.

Figure 4:
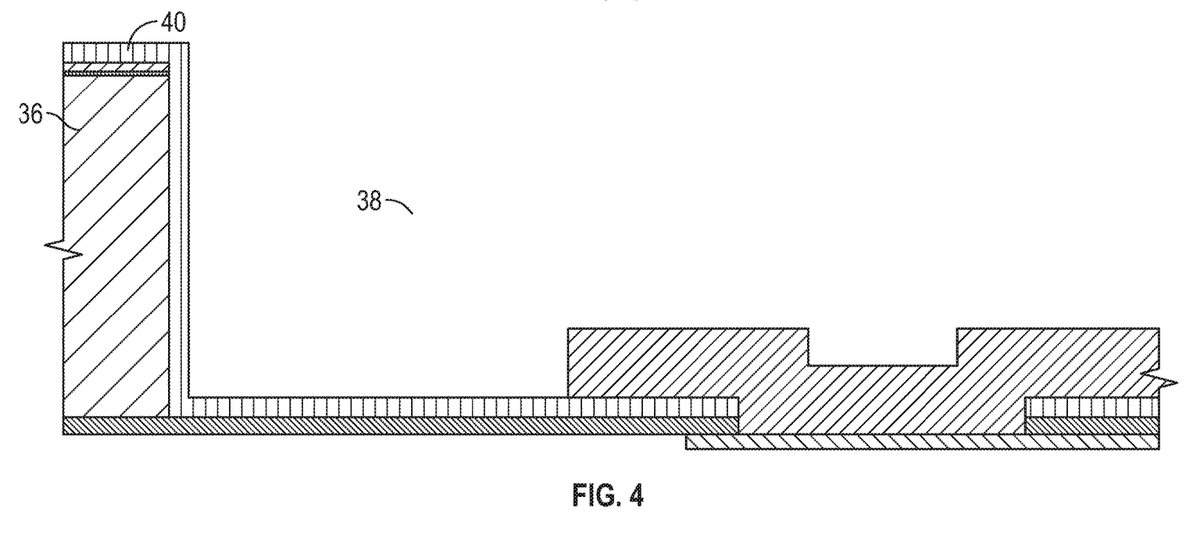
FIG. 4 is a cross-section side view of a portion of a conductive pad region of an image sensor with a deep silicon etch without a fill material.

Referring to FIG. 4, a cross-section side view of a portion of a conductive pad region of an image sensor with a deep silicon etch without a fill material is illustrated. The image sensor of FIG. 4 is similar to the image sensor of FIG. 3, with the primary difference being that the silicon layer 36 is substantially 6 um thick rather than 2.5 um thick. In various implementations, it is desirable to increase the thickness of the silicon layer for, among other reasons, increasing the longer wavelengths (e.g. red, near-infrared) response of the image sensor. However, if the thickness of the silicon layer 36 is increased and the depth of the opening 38 within the silicon layer 36 is increased, the opening 38 may become too deep to fill with a fill material. As illustrated by FIG. 4, no fill material is included in the opening 38. The lack of fill material, specifically the lack of fill material that is coplanar with a surface of the dielectric layer 40 above the silicon layer, may result in streaks, bands, and framing defects in the image formed in subsequent processing of the image sensor and may ultimately result in poor topography which may increase yield loss by 6-18%.

Figure 5:
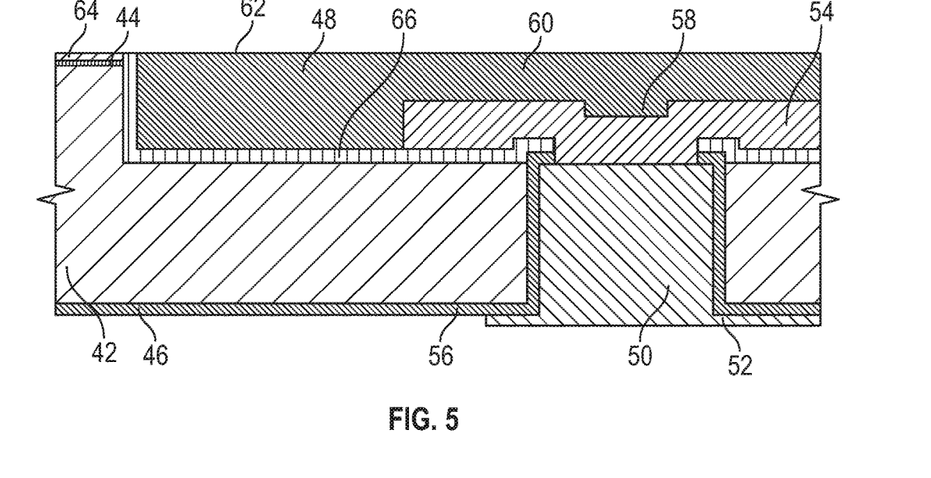
FIG. 5 is a cross-section side view of a portion of an implementation of a conductive pad region of an image sensor with a deep silicon etch.

Referring to FIG. 5, a cross-section side view of a portion of an implementation of a conductive pad region of an image sensor with a deep silicon etch is illustrated. The image sensor of FIG. 5 may include a silicon layer 42. The silicon layer 42 includes a first side 44 and a second side 46 opposite the first side 44. In various implementations, the silicon layer 42 is about 6 um thick, however, in other implementations the silicon layer may be more or less thick than about 6 um. The image sensor also includes an opening 48 extending into the silicon layer 42 from the first side 44 of the silicon layer toward the second side 46 of the silicon layer. In various implementations, the opening 48 may be about 2.5 um deep, and in various implementations, may be 100 um long and 80 um wide. In other implementations, the opening 48 may be more or less deep than about 2.5 um, may be longer or less long than about 100 um, and may be wider or less wide than about 80 um.

In various implementations, the image sensor may include a via 50 extending into the silicon layer 42 from the second side 46 of the silicon layer. In various implementations the via extends about 4 um deep into the silicon layer 42 and has a width of about 5 um, however, in other implementations a width greater or less than about 5 um the via 50 may have a width greater or less than about 5 um and may extend deeper or shallower than about 4 um into the silicon layer 42. The via 50 may have a length (extending into the page as illustrated by FIG. 5) that is about 52 um long, however, in other implementations the length may be more or less than about 52 um. The via 50 includes an electrically and/or thermally conductive material and may include, in various implementations, a metallic material. In such implementations, the via may include, by non-limiting example, copper, gold, silver, aluminum, any other metal or metallic alloy, and any combination thereof. In various implementations the via may be the same as or a different material from the material of the conductive layer 52. In various implementations, the image sensor may include only a single via 50 coupling the conductive layer 52 to a conductive pad 54, however, in other implementations, the image sensor may include two or more vias extending into the silicon layer 42 from the second side 46 of the silicon layer, coupling the conductive layer 52 to the conductive pad 54. In such implementations, the two or more vias may be similar to or the same as any via described herein.

Still referring to FIG. 5, in various implementations the image sensor may include a first dielectric layer 56. The first dielectric layer 56 may be an ILD layer. Though not illustrated by FIG. 5, the first dielectric layer 56 may at least partially encapsulate the conductive layer 52 as is illustrated by FIG. 2A. The first dielectric layer 56 may also separate the material of the via 50 from the silicon layer 42 as illustrated by FIG. 5. In various implementations, the thickness of the dielectric layer at the portion of the dielectric layer that separates the via 50 from the silicon layer 42 may be about 300 nm thick, however, in other implementations it may be more or less thick than about 300 nm. In various implementations, the dielectric layer may be $SiO_2$, or any other type of dielectric material.

As illustrated by FIG. 5, the image sensor includes a conductive pad 54 within the opening 48. In various implementations, the conductive pad 54 is coupled directly to the via 50, however, in other implementations there may be other electrically/thermally conductive elements or layers between the via 50 and the conductive pad 54. In implementations where the conductive pad is directly coupled to the via, the conductive pad may extend through the first dielectric layer 56 and a second dielectric layer 66. The conductive pad is formed of a electrically/thermally conductive material, and may be, by non-limiting example, aluminum, gold, copper, titanium, other metals or metallic alloys, other conductive non-metal materials, or any combination thereof. In various implementations, the conductive pad 54 may include an opening 58 therein which may facilitate adhesion of a fill material 60 to the conductive pad 54.

In various implementations, the image sensor may include a fill material 60 within the opening 48. At least a surface 62 of the fill material may form a plane that is substantially parallel with a plane formed by the first side of the silicon layer 44. Further, the surface 62 of the fill material may be substantially coplanar with a plane formed by the surface of the dielectric layer 64 over the first side 44 of the silicon layer 42. By having the fill material coplanar with the dielectric layer 64, yield loss due to poor topography may be reduced. The fill material may be, by non-limiting example, an epoxy, a resin, SiO$_2$, or any other type of fill material. Though not illustrated by FIG. 5, the fill material includes an opening therein through which the conductive pad 54 is exposed, similar to the opening 32 of FIG. 2A.

In various implementations, the image sensor may include a second dielectric layer 66 which extends along the sides of the opening 48 and separates the fill material 60 from the silicon layer 42. In such implementations the second dielectric layer 66 may serve as a sidewall passivation layer for the sidewalls of the opening 48. The second dielectric layer may also separate the conductive pad 54 from the silicon layer 42. In various implementations, the second dielectric layer 66 may be an adhesion layer to facilitate bonding of the conductive pad 54 to the silicon layer 42. In various implementations, the second dielectric layer 66 may be the same as or include similar materials to any other dielectric layer disclosed herein. Further, in various implementations, the second dielectric layer 66 may include the structure of the dielectric layer 64 over the first side 44 of the silicon layer 42.

Figure 6:
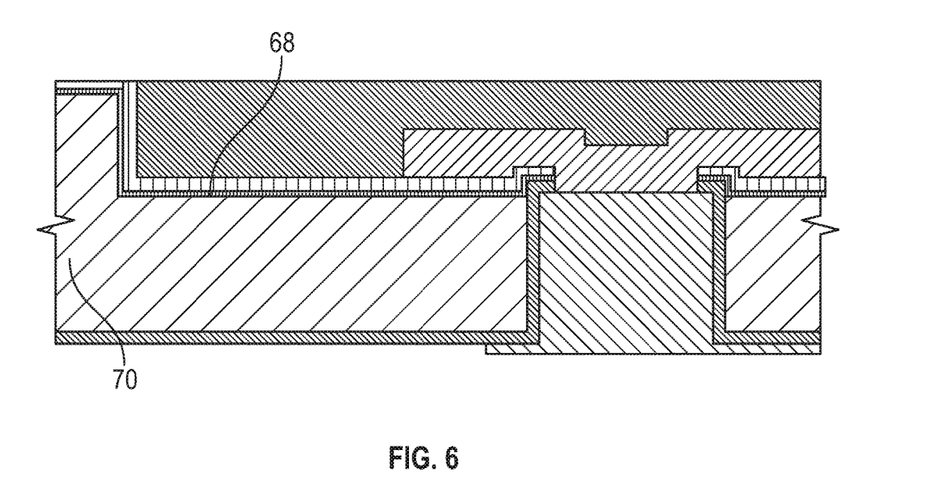
FIG. 6 is a cross-section side view of a portion of another implementation of a conductive pad region of an image sensor with a deep silicon etch.

Referring to FIG. 6, a cross-section side view of a portion of another implementation of a conductive pad region of an image sensor with a deep silicon etch is illustrated. The conductive pad region illustrated in FIG. 6 is essentially the same in structure as the conductive pad region illustrated in FIG. 5, with the difference being that the image sensor of FIG. 6 includes a high dielectric constant dielectric layer 68 lining the silicon layer 70. As used herein, a high dielectric constant layer means a dielectric layer having a dielectric constant which is higher than the dielectric constant of SiO$_2$, which is approximately 3.9. Use of a high dielectric constant layer may reduce the amount of dark current traveling through the image sensor. In various implementations, the high dielectric constant material may include, by non-limiting example, tantalum pentoxide (Ta$_2$O$_5$), aluminum oxide (Al$_2$O$_3$), hafnium dioxide (HfO$_2$), HfO$_x$, any combination thereof, and any other material with a dielectric constant higher than that of SiO$_2$.

Figure 7:
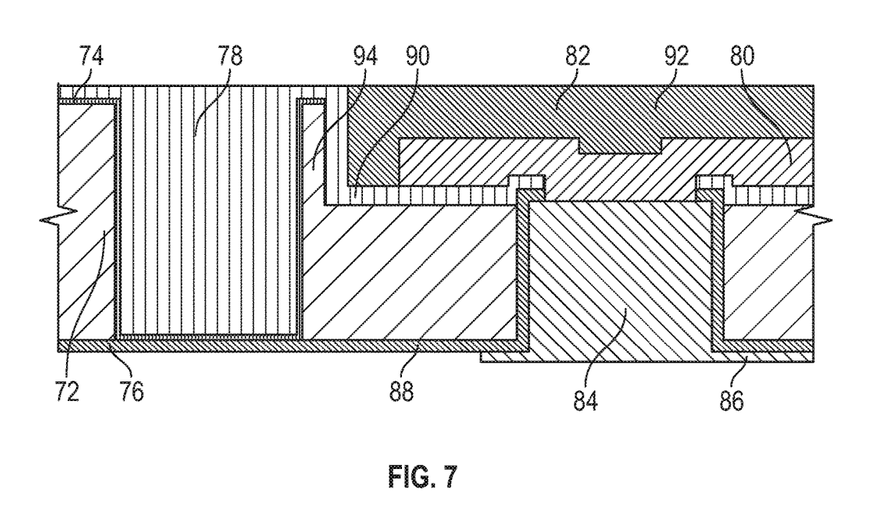
FIG. 7 is a cross-section side view of a portion of an implementation of a conductive pad region of an image sensor with a deep silicon etch and a perimeter etch through the silicon layer.

Referring to FIG. 7, a cross-section side view of a portion of an implementation of a conductive pad region of an image sensor with a deep silicon etch and a perimeter etch through the silicon layer is illustrated. Similar to the image sensor of FIG. 5, the image sensor illustrated by FIG. 7 includes a silicon layer 72 which has a first side 74 and a second side 76. The thickness of the silicon layer may be about 6 um, however, in other implementations the thickness of the silicon layer may be more or less than about 6 um. In various implementations, the image sensor includes a first opening 78 which extends through the silicon layer 72. The first opening 78 isolates the conductive pad 80 from the bulk of the silicon layer 72. In various implementations, the first opening may be lined with a high dielectric constant dielectric layer which may facilitate the reduction of dark current flowing within the image sensor. The high dielectric constant material may be any high dielectric material disclosed herein. The opening may be filled with a fill material. The fill material may be SiO$_2$. In various implementations, the first opening is not lined with the high dielectric constant material but may just be filled with the fill material. Though not illustrated in FIG. 7, the first opening 78 may surround the conductive pad 80, and may be formed as a perimeter etch around the conductive pad. This is more easily visualized by imagining a trench etched into the silicon layer all around the perimeter of the conductive pad as viewed from above, such as the view of FIG. 2B. In this manner, the conductive pad 80 may be completely isolated from the remainder of the silicon layer 72. In various implementations, the first opening may be about 3 um wide, while in other implementations it may be more or less wide than about 3 um.

In various implementations, the first opening may be fully included within the full thickness of the silicon layer 72. For example, in implementations where the thickness of the silicon layer is about 6 um, the entirety of the first opening may extend through the about 6 um portion of the silicon layer. In other implementations, the first opening may partially or fully extend through the thinner portion of the silicon layer 72 which the second opening 82 is over. In such an implementation, the image sensor would not include the portion 94 of the silicon layer separating the first opening 78 from the second opening 82.

The remainder of the conductive pad region illustrated by FIG. 7 may be the same structure and material or of similar structure and material to the conductive pad region illustrated by FIG. 5. Specifically, the image sensor includes a second opening 82, a via 84, a conductive layer 86, a first dielectric layer 88, a conductive pad 80, a second dielectric layer 90 or a high dielectric constant layer 68 like that illustrated in FIG. 6, and a fill material 92. In various implementations, because the conductive pad and the via are isolated from the remainder of the silicon layer 72 due to the first opening 78, the image sensor may not necessarily include a first dielectric layer 88 which separates the via 84 from the silicon layer 72 or a second dielectric layer 90 which separates the conductive pad 80 from the silicon layer 72.

Figure 8:
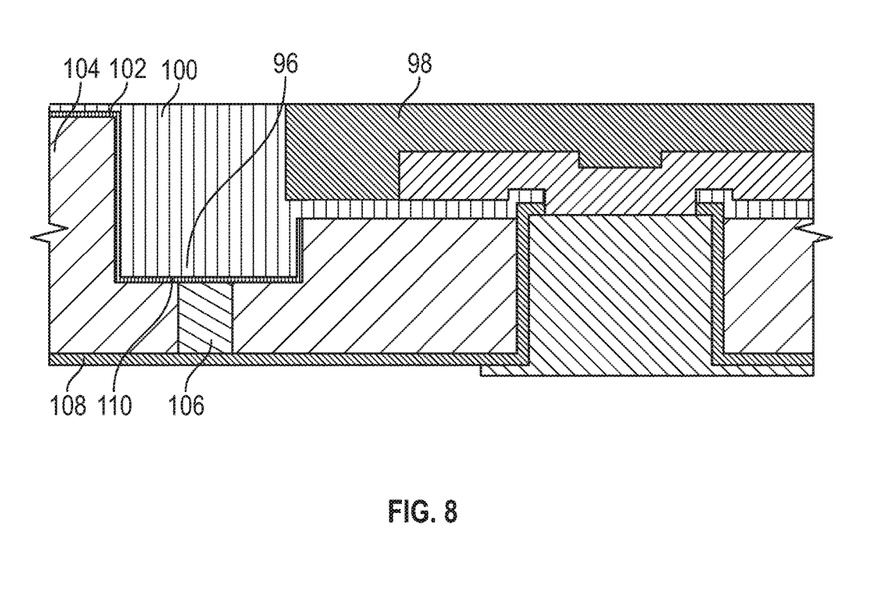
FIG. 8 is a cross-section side view of a portion of an implementation of a conductive pad region of an image sensor with a deep silicon etch and a stepped perimeter etch through the silicon layer.

Referring to FIG. 8, a cross-section side view of a portion of another implementation of a conductive pad region of an image sensor with a deep silicon etch and a perimeter etch through the silicon layer is illustrated. The conductive pad region illustrated by FIG. 8 is similar in structure and materials to the conductive pad region of FIG. 7, with the only differences found in the first opening 96. Unlike the first opening 78 of FIG. 7, the first opening 96 is not separated from the second opening 98 by a portion of the silicon layer similar to portion 94 of FIG. 7. Further, the first opening 96 of FIG. 8 is stepped. In the implementation illustrated by FIG. 8, a first portion 100 of the first opening 96 adjacent to the first side 102 of the silicon layer 104 may be wider than the second portion 106 of the first opening adjacent to the second side 108 of the silicon layer. In other implementations, the second portion 106 may be the same size as, or wider, than the first portion 100. Further, in the implementation illustrated by FIG. 8, a high dielectric constant dielectric layer 110 is illustrated as separating the first portion 100 from the second portion 106. In various implementations, however, the dielectric layer 110 may not be used to separate the first portion 100 from the second portion 106. Further, in various implementations, the dielectric layer 110 may extend into the second portion 106 and cover the sidewalls of the portion 106 of the first opening 96. In various implementations, the second portion 106 may be formed from the second side 108, and may be formed during processing of the first side 102 of the silicon layer. Likewise, the first portion 100 may be formed from the first side 102, and may be formed during processing of the second side 108. In various implementations, the opening necessary to form the first portion 100 may be etched into the silicon layer. In such implementations, the second portion 106 may serve as an etch stop. The etched opening may then be coated with dielectric layer 110, which may be a high dielectric constant dielectric material, filled with an oxide as described later herein, and planarized through using chemical mechanical polishing (CMP) techniques as described later herein.

Figure 9:
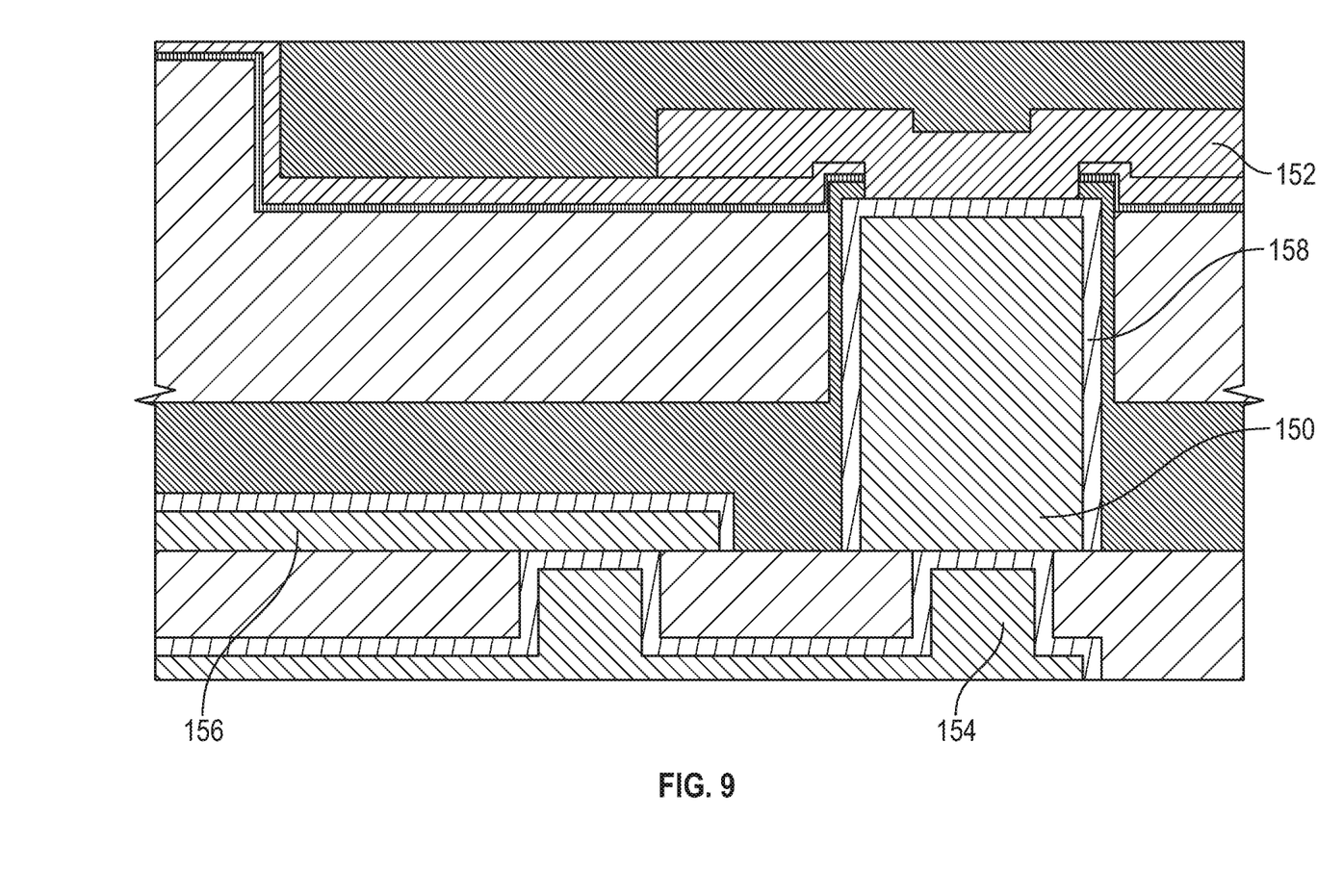
FIG. 9 is a cross-section side view of an implementation of a portion of an image sensor coupled with other conductive portions of the image sensor.

Referring to FIG. 9, a cross-section side view of the portion of the image sensor coupled with other conductive portions of the image sensor is illustrated. In various implementations, the image sensor may include a via 150 directly coupled to a conductive pad 152 and coupled to one or more other vias 154 extending from other conductive layers. In this manner, an entire network of conductive elements, such as conductive layer 156, may be electrically coupled to the conductive pad 152. The vias and conductive layers or traces illustrated by FIG. 9 may be similar to or the same as any other via or conductive layer or trace disclosed herein. Further, in various implementations, the via 150 may be coated with a barrier layer 158 to prevent migration of copper and other metals from the via into the silicon and other structures of the device. In implementations where the second opening in the silicon layer and the opening in the dielectric layer are etched, the barrier layer 158 may also act as an etch stop during the backside etch of the silicon layer and the dielectric layer. This may prevent the exposure of the vias during the etch, and may prevent contamination of the etch chamber by the vias. The barrier layer may also serve as an adhesion layer for the via. In various implementations, the barrier layer may include tantalum, tantalum nitride, titanium, titanium nitride, tungsten, tungsten nitride, or any other barrier layer material. In particular implementations, the barrier layer may coat portions of multiple vias and conductive layers.

FIGS. 10-11 illustrate a method of forming the conductive pad region illustrated in FIG. 5. Specifically, FIGS. 10A-10F illustrate a process flow of the method for forming the image sensor of FIG. 5 as seen from bottom and top views. Referring to FIG. 10A, the method for forming a conductive pad region in an image sensor may include forming one or more openings 112 into a second side 114 of a silicon layer 116. In various implementations, the openings may be etched. In such implementations, the openings may be etched using, by non-limiting example, plasma etching, deep-reactive ion etching, or wet chemical etching. In various implementations, a process marketed under the tradename BOSCH® by Robert Bosch GmbH, Stuttgart Germany (the "Bosch process"), may be used to form the openings 112 in the silicon layer 116. As the conductive pad region is oriented in FIG. 5, the view of FIG. 10A corresponds to a bottom view. The method includes forming one or more vias 118 within the one or more openings 112.

Figure 10A:
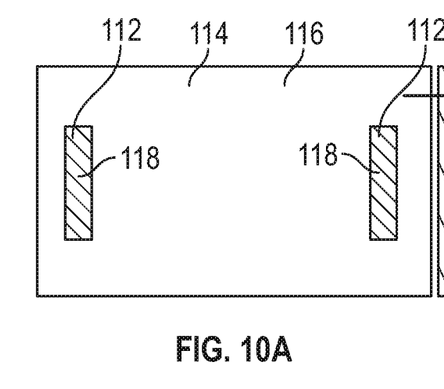
FIGS. 10A-10F are bottom and top views illustrating a process flow of the method for forming the image sensor of FIG. 5.
Figure 10B:
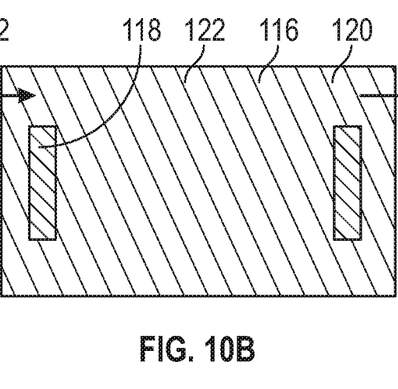

Referring to FIG. 10B, the method includes forming an opening 120 within the first side 122 of the silicon layer 116. The opening may be formed using any etching technique disclosed herein. The view of FIG. 10B (as well as FIGS. 10C-10F) corresponds to a top view of FIG. 5 based on the orientation illustrated in FIG. 5. In various implementations, the opening may be formed deep enough to expose the vias 118 from the first side 122 of the silicon layer 116.

Figure 10C:
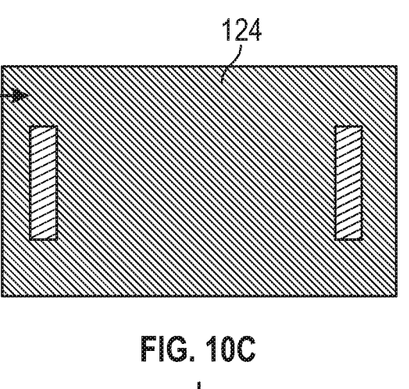
Figure 10D:
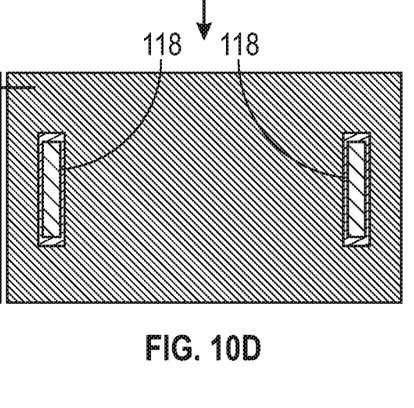

Referring to FIG. 10C, the method may include forming a dielectric layer 124 over the first side 122 of the silicon layer 116. The dielectric layer covers the one or more vias, though the vias are still visible in FIG. 10C. Referring to FIG. 10D, the method of forming the conductive pad region may include etching through the dielectric layer to expose the vias. In various implementations, and as illustrated by FIG. 10D, a portion of the dielectric layer may remain over the edges of the vias 118, thus only a middle portion of the vias 118 are exposed.

Figure 10E:
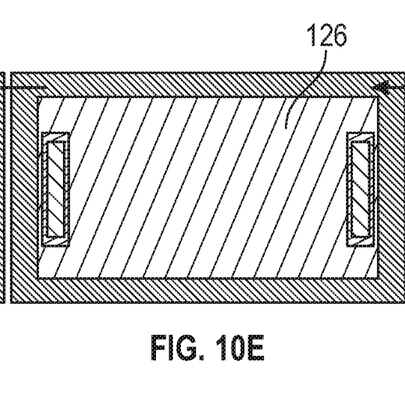
Figure 10F:
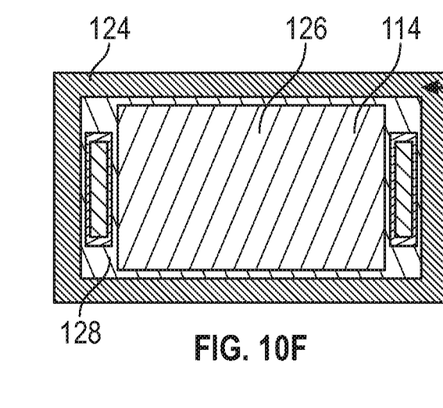

Referring to FIG. 10E, the method for forming a conductive pad region includes forming a conductive pad 126 over the vias 118. Though the vias 118 are still illustrated in FIG. 10E, it is understood that the conductive pad covers the vias 118. The method may also include filling the opening 114 in the first side of the silicon layer 116 with a fill material 128, and etching through the fill material 128 to expose the conductive pad 126, as illustrated by FIG. 10F. In various implementations, the method may include planarizing the fill material in a manner that allows it to be coplanar with the dielectric layer 124 covering the silicon layer. In other implementations, the fill material may be planarized in a manner that allows it to be coplanar with a separate dielectric layer over the silicon layer 116. The surface of the fill material seen in FIG. 10F may form a plane substantially parallel with the semiconductor layer.

In various implementations, the method for forming the conductive pad region may include forming an opening around a perimeter of the conductive pad using a perimeter etch. The opening may be etched using any etching technique previously disclosed herein. This may be formed before or after the conductive pad is coupled to the one or more vias. In various implementations, the opening around the perimeter of the conductive pad extends entirely through the silicon layer and may be etched from either the first side, the second side, or both the first and the second side.

Figure 11A:
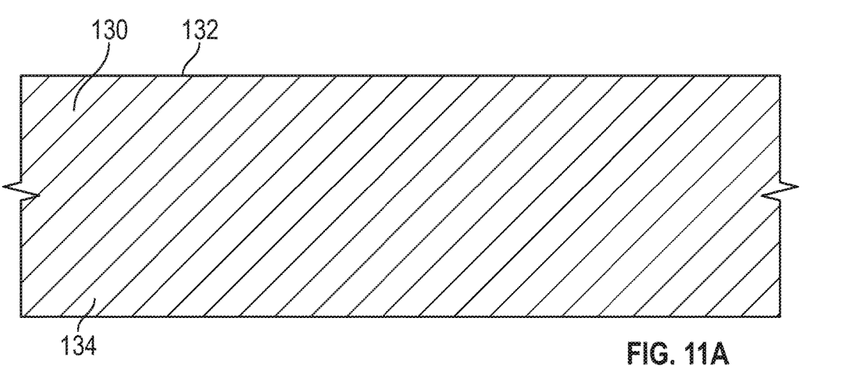
FIGS. 11A-11I are cross-section side views illustrating a process flow of the method for forming the image sensor of FIG. 5.
Figure 11B:
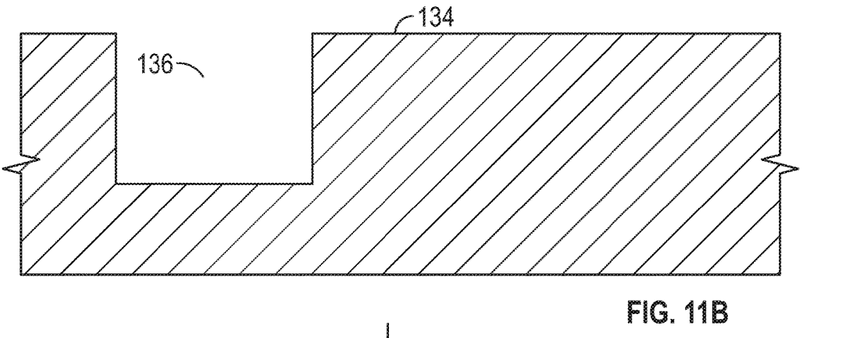
Figure 11C:
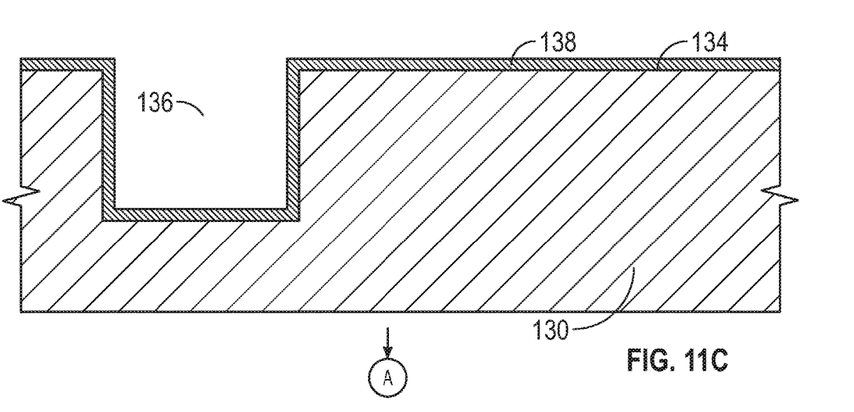

Referring to FIGS. 11A-11I, cross section side views illustrating a process flow of the method for forming the conductive pad region illustrated by FIG. 5 is shown. The process flow illustrated by FIGS. 11A-11I essentially covers the same process illustrated by FIGS. 10A-10F, just from a different perspective. Referring to FIG. 11A, a cross-section side view of a silicon layer 130 is illustrated. In this particular implementation, the silicon layer may be an epitaxial silicon layer which may be part of a much thicker wafer made of silicon. The silicon layer includes a first side 132 and a second side 134. The silicon layer may be about 6 um thick, though in other implementations it may be more or less thick than about 6 um. Referring to FIG. 11B, the method may include forming a first opening 136 into a second side 134 of the silicon layer 130. The opening may be etched using any etching technique previously disclosed herein. In various implementations, and as illustrated by FIG. 11C, the method for forming the conductive pad region may include forming a first dielectric layer 138 over the second side 134 of the silicon layer 136. The first dielectric layer may also extend along the sides of the opening 136 as illustrated by FIG. 11C. The first dielectric layer may be an ILD and may be any type of material previously disclosed herein. In other implementations, the method may not include forming a first dielectric layer.

Figure 11D:
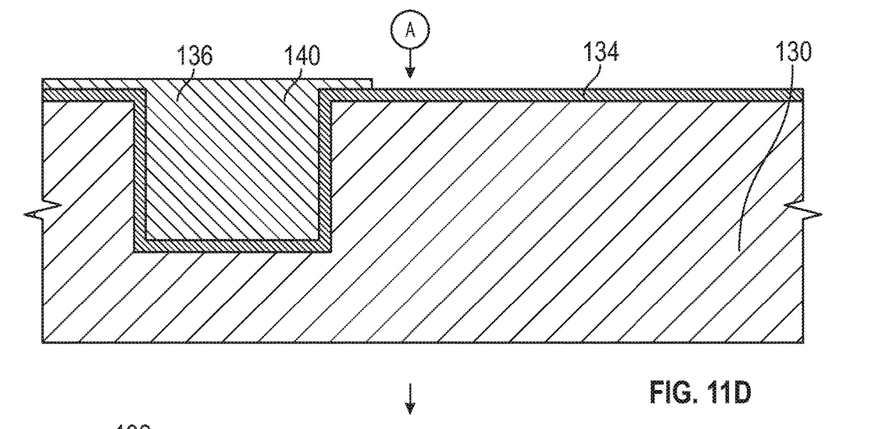

Referring to FIG. 11D, the method may include forming the material of a via within the opening 136 in the second side 134 of the silicon layer 130. While only a single via is illustrated in FIG. 11D, it is understood that the method may include forming other vias not illustrated by FIG. 11D. The materials included in the via may be the same as or similar to any type of via previously disclosed herein. The perimeter of the via may be, by non-limiting example, circular, ovate, elliptical, a square, rectangular, or any other closed shape.

Figure 11E:
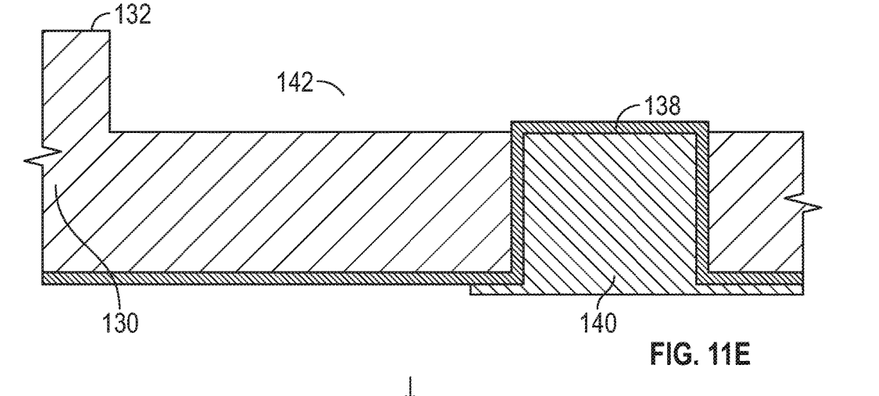

Referring to FIG. 11E, the method may include etching an opening 142 into the first side 132 of the silicon layer 130. In various implementations, the depth of the opening 142 may be etched about 2.5 um into the silicon layer 130, while in other implementations it may be etched deeper or less deep than about 2.5 um. The opening may be etched deep enough to expose the first dielectric layer 138 in implementations with a first dielectric layer. In implementations without a first dielectric layer, the opening may be etched deep enough to expose the via 140. The opening may be etched using any etching technique disclosed herein.

Figure 11F:
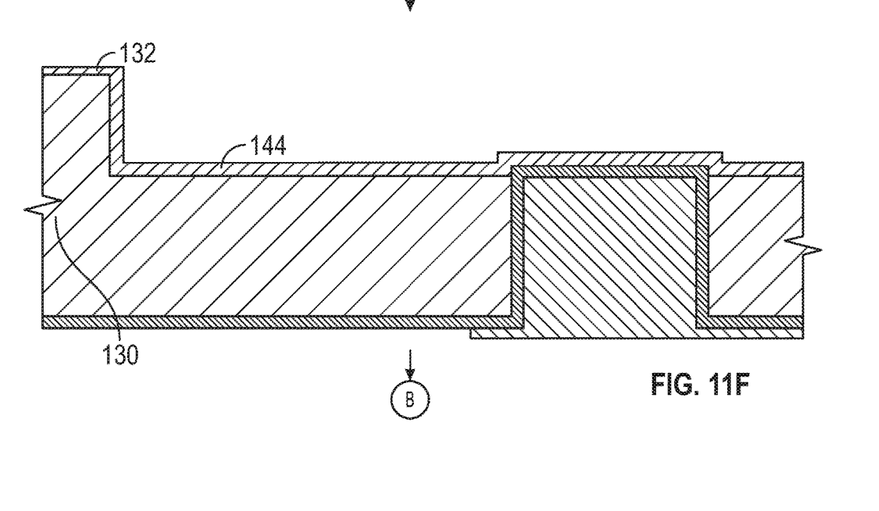
Figure 11G:
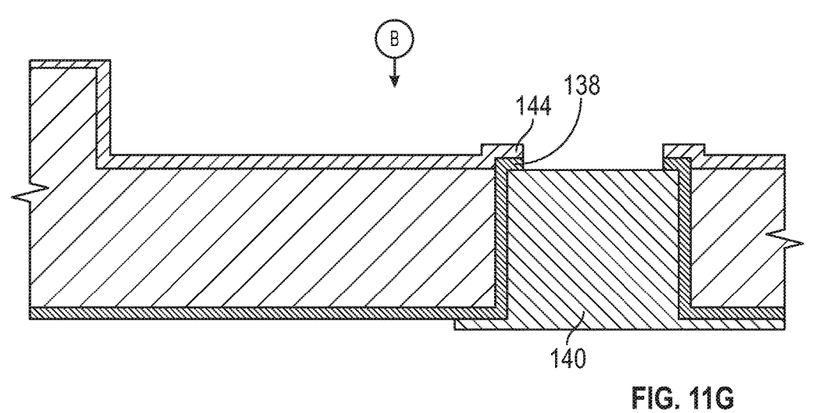
Figure 11H:
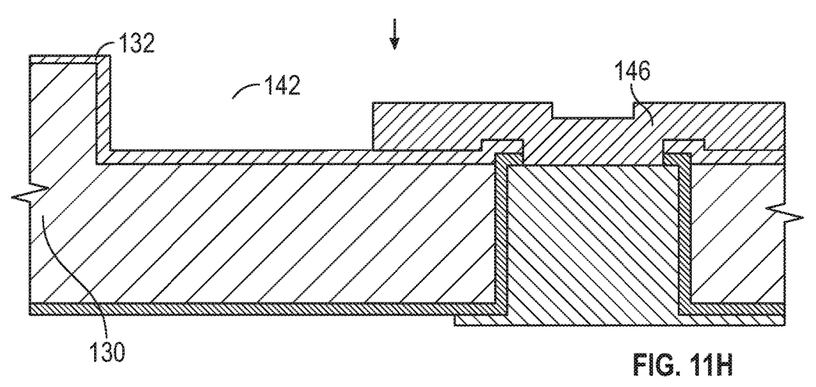

Referring to FIG. 11F, the method may include forming a second dielectric layer 144 over the first side 132 of the silicon layer 130. The second dielectric layer may be the same as or similar to any type of dielectric layer previously disclosed herein. In particular implementations, the second dielectric layer may include a high dielectric constant dielectric layer. Referring to FIG. 11G, the method for forming the conductive pad region illustrated in FIG. 5 includes etching through the first dielectric layer 138 and the second dielectric layer 144 to expose the via 140. In various implementations the etch will stop at a barrier or adhesion layer (not illustrated) that encapsulates the via 140. Referring to FIG. 11H, the method may include forming a conductive pad 146 within the opening 142 within the first side 132 of the silicon layer 130. In the implementation illustrated, the conductive pad 146 is directly coupled to the via 140. The conductive pad may be the same as or similar to any conductive pad disclosed herein.

Figure 11I:
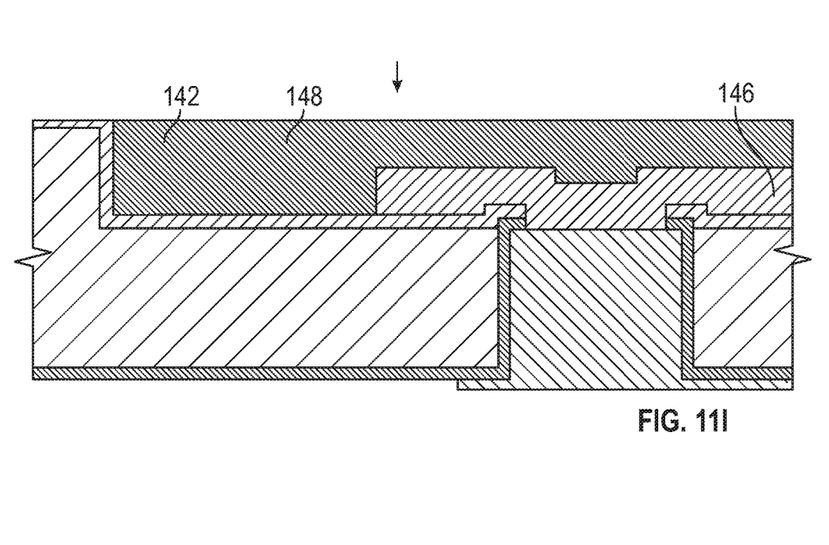

Referring to FIG. 11I, the method may include filling the opening 142 in the first side 132 of the silicon layer 130 with a fill material 148. The fill material may be the same as or similar to any fill material disclosed herein. The method may include planarizing the fill material 148 to form a plane substantially parallel with the first side 132 of the silicon layer 130. In various implementations, the fill material 148 is planarized to be coplanar with a surface of a dielectric layer 144 over the first side 132 of the silicon layer 130. While FIG. 11I illustrates the dielectric layer 144 being over the first side 132 of the silicon layer 130, in other implementations a dielectric layer separate from the second dielectric layer 144 may be over the first side 132 of the silicon layer 130. The fill material may be planarized using chemical mechanical polishing CMP techniques or any other planarizing technique. Though not illustrated by FIG. 11I, the method may also include etching an opening through the fill material 148 to expose the conductive pad 146.

The method for forming a conductive pad region like those illustrated in FIGS. 7-8 may be carried out using processes similar to the method illustrated by FIGS. 10A-10I, with the difference being that the method may include forming a perimeter etch through the entire thickness of the silicon layer which extends around the conductive pad. In various implementations, it may be formed before or after the conductive pad is coupled to the via. Specifically, referring to FIG. 11B and FIG. 11E, it may be formed at the same time the opening 136 is formed into the second side 134 of the silicon layer 130, at the same time the opening 142 is formed into the first side 132 of the silicon layer, or at both the time the opening 136 and the opening 142 are formed. In other implementations, the perimeter etch may be formed before and/or after either the opening 136 or the opening 142 is formed. Further, the perimeter etch may be formed from the first side of the silicon layer, the second side of the silicon layer, or from both the first and the second side of the silicon layer. In various implementations, the perimeter etch may be formed using any etching technique disclosed herein or any etching technique disclosed in U.S. Pat. No. 7,544,592 to Kirby et al., entitled "Method for increasing etch rate during deep silicon dry etch," issued Jun. 9, 2009, and U.S. Pat. No. 8,110,488 to Kirby et al., entitled "Method for increasing etch rate during deep silicon dry etch," issued Feb. 7, 2012, the disclosures of each of which are hereby incorporated entirely herein by reference. In other implementations, the perimeter etch may be stepped. In such implementations, the perimeter etch may be formed by partially etching through the silicon layer from the first side, and partially etching through the silicon layer from the second side in a manner that the etch from the second side connects with the etch from the first side, thus forming an opening through the entirety of the silicon layer. The etch from the first side may be wider than, smaller than, or the same size as the etch from the second side of the silicon layer. In other implementations the stepped etch may be formed from a single side of the silicon layer.

In places where the description above refers to particular implementations of image sensors and implementing components, sub-components, methods and sub-methods, it should be readily apparent that a number of modifications may be made without departing from the spirit thereof and that these implementations, implementing components, sub-components, methods and sub-methods may be applied to other image sensors.

What is claimed is:

1. An image sensor comprising:
   a silicon layer comprising a first side and a second side opposite the first side;
   an opening extending into the silicon layer from the first side of the silicon layer toward the second side;
   a via extending into the silicon layer from the second side of the silicon layer; and
   a conductive pad within the opening, the conductive pad coupled to the via;
   wherein the opening comprises a fill material;
   wherein at least a portion of the fill material forms a plane that is substantially parallel with a plane formed by the first side of the silicon layer; and
   wherein the conductive pad is exposed through an opening in the fill material.

2. The image sensor of claim 1, further comprising a dielectric layer between the silicon layer and the via.

3. The image sensor of claim 1, further comprising a dielectric layer between the fill material and the silicon layer.

4. The image sensor of claim 1, further comprising a high dielectric constant dielectric layer between the fill material and the silicon layer.

5. The image sensor of claim 1, further comprising a second via extending into the silicon layer from the second side of the silicon layer, the second via coupled to the conductive pad.

6. The image sensor of claim 1, wherein the silicon layer is 6 micrometers thick and the opening is 2.5 micrometers deep.

7. The image sensor of claim 1, wherein the via comprises copper.

8. An image sensor comprising:
   a silicon layer comprising a first side and a second side opposite the first side;
   a first opening extending through the silicon layer;
   a second opening extending into the silicon layer from the first side of the silicon layer;
   a via extending into the silicon layer from the second side of the silicon layer; and
   a conductive pad within the second opening, the conductive pad coupled to the via;
   wherein the second opening comprises a fill material;
   wherein at least a portion of the fill material forms a plane that is substantially parallel with a plane formed by the first side of the silicon layer; and
   wherein the conductive pad is exposed through an opening in the fill material.

9. The image sensor of claim 8, wherein the first opening further comprises a first portion wider than a second portion.

10. The image sensor of claim 8, wherein the silicon layer is 6 micrometers thick and the opening is 2.5 micrometers deep.

11. The image sensor of claim 8, further comprising a dielectric layer between the silicon layer and the via.

12. The image sensor of claim 8, further comprising a dielectric layer between the fill material and the silicon layer.

13. The image sensor of claim 8, further comprising a high dielectric constant dielectric layer between the fill material and the silicon layer.

14. A method for forming a conductive pad in an image sensor, the method comprising:

etching an opening into a second side of a silicon layer;

forming a via within the opening in the second side of the silicon layer;

etching an opening into a first side of the silicon layer;

forming a dielectric layer over the first side of the silicon layer;

etching through the dielectric layer to expose the via;

forming the conductive pad within the opening in the first side of the silicon layer, the conductive pad coupled to the via;

filling the opening in the first side of the silicon layer with a fill material;

planarizing the fill material to form a plane substantially parallel with a planed formed by the first side of the silicon layer; and etching an opening through the fill material to expose the conductive pad.

15. The method of claim 14, further comprising forming a dielectric layer between the via and the silicon layer.

16. The method of claim 14, wherein the silicon layer is 6 micrometers thick and the opening is 2.5 micrometers deep.

* * * * *